(12) United States Patent
Sprietsma et al.

(10) Patent No.: US 6,288,906 B1
(45) Date of Patent: Sep. 11, 2001

(54) MULTIPLE LAYER PRINTED CIRCUIT BOARD HAVING POWER PLANES ON OUTER LAYERS

(75) Inventors: John T. Sprietsma, Hillsboro; Steve Joy, Portland; Julie Scheyer-Furnanz, Hillsboro, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/216,780

(22) Filed: Dec. 18, 1998

(51) Int. Cl.[7] ...................................................... H01R 9/00
(52) U.S. Cl. ........................ 361/772; 361/767; 361/795; 361/794; 174/260; 174/261
(58) Field of Search ..................................... 361/767, 772, 361/782, 712, 600, 768, 780, 795, 794; 174/260, 261, 266

(56) References Cited

U.S. PATENT DOCUMENTS

| | | | |
|---|---|---|---|
| 4,910,643 | * | 3/1990 | Williams ................................ 361/414 |
| 5,249,098 | * | 9/1993 | Rostoker et al. ..................... 361/600 |
| 5,278,524 | * | 1/1994 | Mullen ...................................... 333/1 |
| 5,396,397 | * | 3/1995 | McClanahan et al. .............. 361/313 |
| 5,557,502 | * | 9/1996 | Banerjee et al. ...................... 361/712 |

* cited by examiner

Primary Examiner—Jeffrey Gaffin
Assistant Examiner—Thanh Y. Tran
(74) Attorney, Agent, or Firm—Schwegman, Lundberg, Woessner & Kluth, P.A.

(57) ABSTRACT

A multi-layer printed circuit board includes power planes located on outer conductive layers. The outer conductive layers are patterned to accept circuitry, such as integrated circuits and surface mount devices. Mounting pads are provided on the outer conductive layers which include plated through vias for electrical interconnection with other conductive layers of the printed circuit board. To increase solderability, the plated through vias are located on the mounting pads such that they are covered by the circuit component mounted thereto. By locating the vias under the electrical components, such as surface mount capacitors, the quality of solder fillets is increased. To enhance heat dissipation, openings are provided in solder masks located on exterior surfaces of the outer conductive planes. These openings are located in the solder mask to expose the conductive plane. As such, the openings are located in areas where circuitry is not mounted to the printed circuit board.

15 Claims, 3 Drawing Sheets

MULTIPLE LAYER PRINTED CIRCUIT BOARD HAVING POWER PLANES ON OUTER LAYERS

TECHNICAL FIELD OF THE INVENTION

The present invention relates generally to circuit boards and in particular the present invention relates to circuit boards having power planes on outer layers.

BACKGROUND OF THE INVENTION

Electronic manufacturers use printed circuit boards to electrically connect integrated circuits, and other electrical components such as capacitors and resistors. Population densities of printed circuit boards have increased with the complexity of circuitry and the reduction in size of components. For example, computer motherboards can include hundreds of components including various integrated circuits and surface mount components.

As printed circuit board designs have increased in complexity, the need for additional interconnect lines between the components coupled to the printed circuit boards have increased. To address this need, manufactures have provided multiple layer printed circuit boards where several layers of conductors are separated by layers of dielectric material. These multiple layer circuit boards are fabricated such that the intermediate conductor layers provide power and ground planes to the printed circuit board. The outer layers of the printed circuit board, therefore, are patterned to provide the interconnects and mounting pads for components which are ultimately coupled to the printed circuit board. FIG. 1 illustrates a multiple layer printed circuit board where the intermediate layers provide power, and the outer layers provide interconnect traces.

The conductive layers of the multiple layer printed circuit boards are connected to each other using vias which are plated with conductive material to provide plated through holes. The vias are located across the printed circuit board and connected to mounting locations on the outer conductive planes using conductive traces. That is, mounting pads for integrated circuits and surface mount components are not directly connected to plated through holes, but are connected to the plated through hole locations using a patterned conductive trace.

With the increased population density of integrated circuits, concerns about electromagnetic interference (EMI), power/heat dissipation, and power delivery increase. For the reasons stated above, and for other reasons stated below which will become apparent to those skilled in the art upon reading and understanding the present specification, there is a need in the art for a printed circuit board which addresses the above concerns while maintaining current circuit board assembly quality, including solder joints.

SUMMARY OF THE INVENTION

A multiple layer printed circuit board comprising a first intermediate conductive layer having conductive interconnect traces formed therein, a first outer conductive layer located above the first intermediate conductive layer and separated from the first intermediate conductive layer by a first dielectric layer, and a second outer conductive layer located below the first intermediate conductive layer and separated from the first intermediate conductive layer by a second dielectric layer. The first outer conductive layer is coupled to a first power supply voltage to provide a first power supply conductive plane, and the second outer conductive layer is coupled to a second power supply voltage to provide a second power supply conductive plane. A plurality of plated vias traverse through the first intermediate conductive layer, the first and second outer conductive layers, and the first and second dielectric layers to selectively couple at least two of the conductive layers. Circuit mounting pads are formed in either the first or second outer conductive layers, the circuit mounting pads are sized to accept a circuit component. Wherein one of the plurality of plated vias traverses through one of the circuit mounting pads such that the plated via is located in a region of the mounting pad which is beneath the circuit component when the circuit component is connected to the mounting pad.

A printed circuit board mounting pad comprises a first conductive region sized to accept a circuit device intended to be soldered to the mounting pad. The first conductive region is located beneath the circuit device when the circuit device is soldered to the mounting pad. A second conductive region is provided and integral with the first conductive region. The second conductive region is located laterally outside of the circuit device when the circuit device is soldered to the mounting pad, such that the second conductive region provides a solder fillet area. A plated via is located in the first conductive region and extending downwardly through the mounting pad for electrical interconnection with conductive regions located below the mounting pad.

BRIEF DESCRIPTION OF THE DRAWINGS

FIG. 4b illustrates a cross-section of the surface mount interconnect pad of FIG. 4a;

FIG. 5b is a cross section of the mounting pad of FIG. 5a;

FIG. 6b is a cross section of the mounting pad of FIG. 6a; and

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
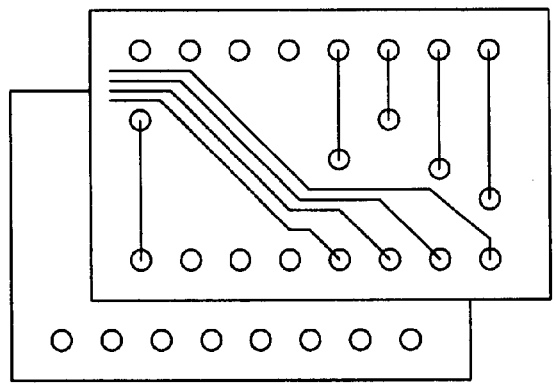
FIG. 1 is a prior art printed circuit board having intermediate power planes.
Figure 2:
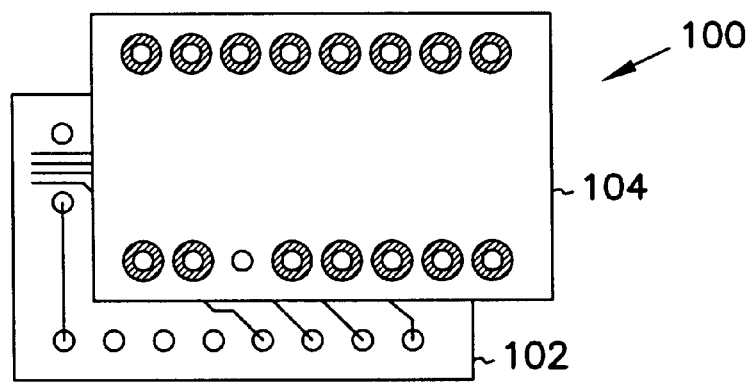
FIG. 2 illustrates a printed circuit board having outer layer power planes.
Figure 3:
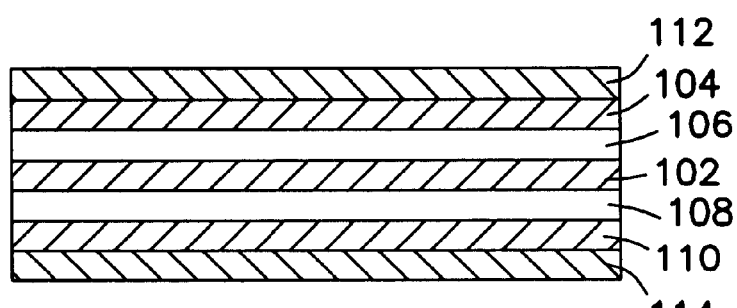
FIG. 3 illustrates a cross section of a printed circuit board having outer layer power planes.

FIGS. 2 and 3 illustrate one embodiment of a printed circuit board 100 having multiple conductive layers, wherein the outer most conductive layers 104 and 110 are fabricated as power planes. That is, one outer conductive layer 104 is designated as a positive power supply plane, while the second outer conductive layer 110 is designated as a lower power supply, or ground plane. Intermediate conductive layer 102 is fabricated to provide patterned interconnect lines. The conductive layers are separated by dielectric layers 106 and 108. Further, multiple intermediate conductive layers can be provided, but one is illustrated for simplicity. As understood by those skilled in the art, intermediate conductive layer 102 of a multi-layer circuit board can be connected using vias. The vias traverse through each layer and are plated with a conductive layer, such as copper to form a plated through hole. Because the outer layers of the circuit board are power planes, clearance areas are provided around plated through holes which are not intended to be connected to the power plane surface. In addition, mounting pads are fabricated using the conductor of the power plane (s) to allow components such as integrated circuits and surface mount devices (capacitors, resistors) to be mounted on the exterior surface of the printed circuit board. While the mounting pads are fabricated from the same conductor as the power plane, they can be separated from the portion of the power plane conductor which is coupled to the power supply.

Locating the power planes on the outer layers of the printed circuit board provides several benefits. First, as a result of the plating process to plate the vias traversing integrated circuit layers, the outer conductive layers have a thickness which is greater than the intermediate conductive layers. This increased thickness reduces the conductive layer resistance, thereby increasing power distribution efficiency throughout the circuit board. An additional benefit of placing the power planes on the outer layers is increased shielding against electromagnetic interference (EMI). That is, electromagnetic interference affects printed circuit boards having numerous narrow, closely spaced interconnect traces. By locating these interconnect traces on the intermediate conductive layers, the outer power planes effectively shield the interconnects from radiating electromagnetic noise beyond the power planes. Further, locating the power planes on the outer layers of the printed circuit board allows for better heat dissipation during operation. This heat dissipation can be further increased by placing strategic openings in a solder mask layer 112 and 114 which is applied to the outer conductive layers, as explaining greater detail below. FIG. 3 illustrates a cross-section of the multi-layer printed circuit board of FIG. 2. The circuit board includes at least one intermediate conductive layer 102. This conductive layer is separated from other conductive layers by at least one layer of dielectric, or insulating material 106 and 108. One exterior conductive layer is a power plane for distributing a power supply, Vcc, to circuits mounted on the circuit board. A second exterior conductive layer is a power ground plane for coupling circuits mounted on circuit board to electrical ground, or a low power supply, Vss. Because circuitry will be soldered to mounting pads located on at least one of the exterior conductive surfaces, a solder mask is applied to both exterior conductive surfaces. As known to those skilled in the art, openings in the solder masks allow the underlying conductive layer to be coated with a material, such as tin, to increase solderability. As such, openings are traditionally only located where a component is desired to be soldered.

Figure 4A:
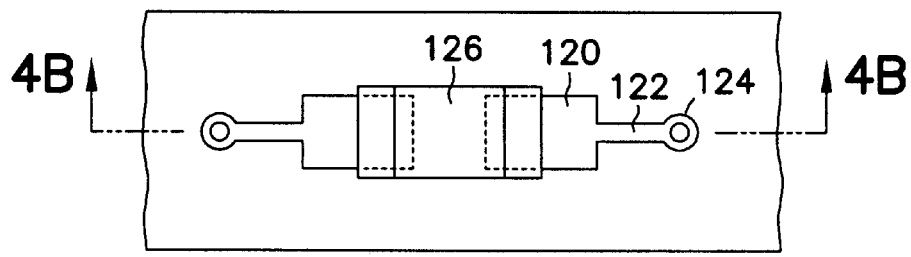
FIG. 4a illustrates a prior art surface mount interconnect pad.
Figure 4B:
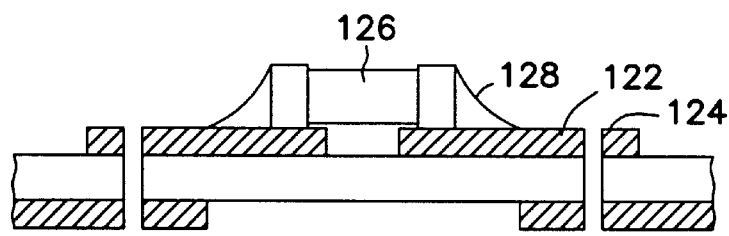

Referring to FIGS. 4a and 4b, a prior art surface mount pad is described. The surface mount pad 120 is typically provided on a circuit board layer which includes traces, i.e., not a power plane surface. The surface mount pad includes interconnect trace 122, and a plated through hole area 124. A surface mount component 126 is located on top of surface mount pads and typically solder thereto. As seen in the circuit board cross-section of FIG. 4b, solder fillets 128 are formed on ends of the surface mount device. This configuration, provides a higher than desired loop inductance as a result of the interconnect trace length.

Figure 5A:
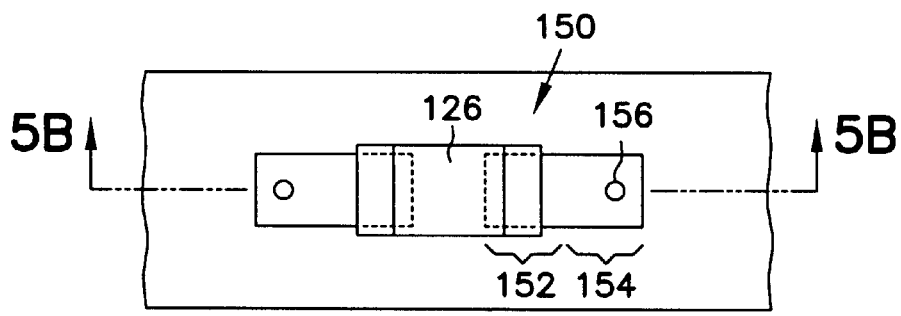
FIG. 5a illustrates a mounting pad having a via-in-pad.
Figure 5B:
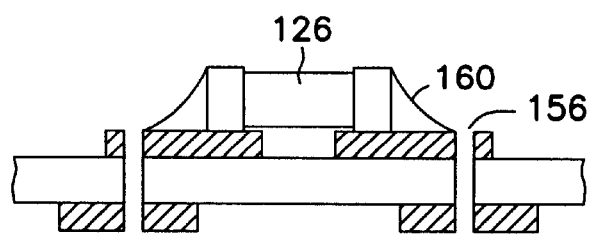

Referring to FIGS. 5a and 5b, a new mounting pad 150 is described which includes a via, or plated through hole, traversing through the pad surface. The mounting pads include a landing area 152 in which a surface mount device 126, or other component, comes into physical contact with the pad. As shown in FIG. 5b, the plated through hole 156 is located on the mounting pad in the location 154 which is not underneath the surface mount component. A reduction in inductance of the resultant circuit is achieved over the circuit of FIG. 4a because the conductive distance between the component mounted on the circuit board and the plated through holes are decreased. A problem, however, can be experienced in soldering the surface mount component to the mounting pads when the plated vias are located close to, but outside of, the surface mount device. That is, creating solder fillets 160 on the outside edge of the surface mount device can be difficult when the plated through holes are located where the solder fillet is desired, FIG. 5b.

Figure 6A:
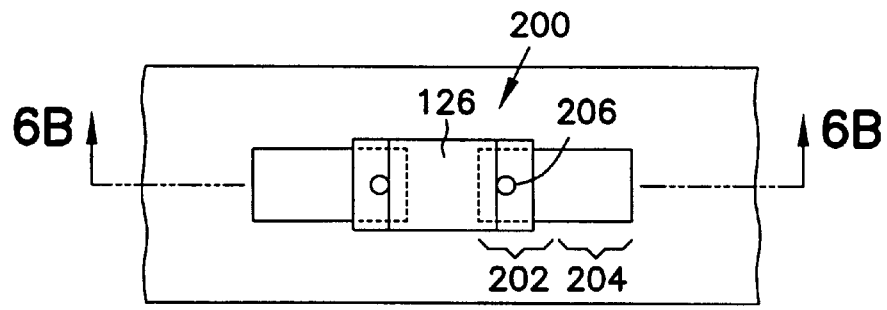
FIG. 6a illustrates an alternate embodiment of a mounting pad having a via-in-pad.
Figure 6B:
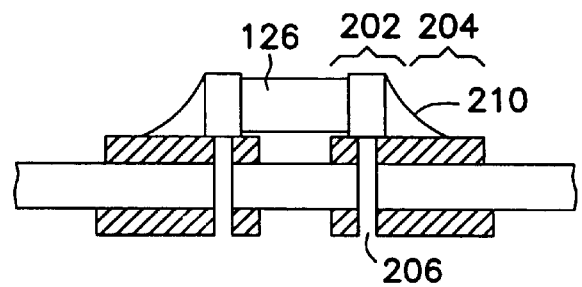

To address solder problems, a printed circuit board is fabricated with mounting pads 200 having plated vias located under surface mount components. Referring to FIGS. 6a and 6b, mounting pads are illustrated for receiving an electrical component 126, such as a surface mount capacitor. The mounting pads, therefore, are sized such that a first portion 202 of the mounting pad physically supports the electrical component. A second portion 204 of the mounting pads provide an area for soldering the components to the mounting pads. By locating the plated vias 206 under the surface mount component, more uniform solder fillets 210 can be achieved. The above described mounting pads reduce circuit loop inductance, increase solder fillet quality, and reduce the amount of conductive material which needs to be removed from the power plane conductor. That is, less surface area of the conductive planes is consumed for interconnects because conductive traces are not required to connect mounting pads to plated through holes.

Figure 7:
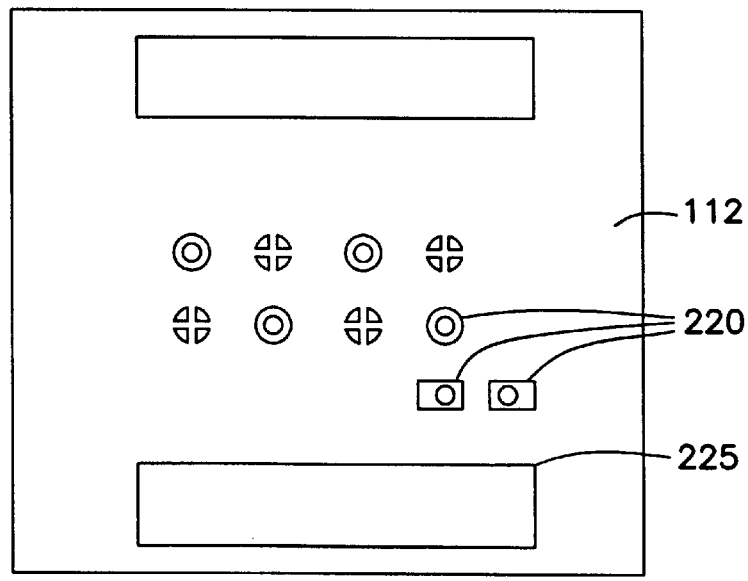
FIG. 7 is a top view of the printed circuit board of FIG. 3.

As stated above, locating the power plane conductors on outside layers of the multi-layer circuit board increases heat dissipation. As illustrated in FIG. 3, solder masks 112 and 114 are provided on the exterior surface of the outer conductive layers. Referring to the top view of the printed circuit board of FIG. 7, openings 220 are provided in solder mask 112 over contact locations or mounting pads. As explained above, these openings allow the underlying conductive layer (power planes) to be, coated with tin to increase solderability. It has been determined that the solder masks act as a heat insulating layer. Thus, heat dissipation is decreased by adding the solder mask layer. Additional openings 225 have been provided in the solder mask to increase heat dissipation. These openings are located in areas of the printed circuit board where components are not connected. That is, unlike prior circuit boards, openings are provided where an integrated circuit, or surface mount type device, will not be mounted. These openings can be sized and located on the printed board surface to maximize heat dissipation. Because each printed circuit board designed is unique, it will be appreciated that the openings are dependent upon a layout of the printed circuit board. However, it is anticipated that openings in the solder mask will be located near circuits which conduct relatively large currents.

A multi-layer printed circuit board has been described which includes power planes located on outer conductive layers. The outer conductive layers are patterned to accept circuitry, such as integrated circuits and surface mount devices. Mounting pads are provided on the outer conductive layers which include plated through vias for electrical interconnection with other conductive layers of the printed circuit board. To increase solderability, the plated through vias are located on the mounting pads such that they are covered by the circuit component mounted thereto. By locating the vias under the electrical components, such as surface mount capacitors, the quality of solder fillets is increased. To enhance heat dissipation, openings are provided in solder masks located on exterior surfaces of the outer conductive planes. These openings are located in the solder mask to expose the conductive plane. As such, the openings are located in areas where circuitry is not mounted to the printed circuit board.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A multiple layer printed circuit board comprising:

a first intermediate conductive layer having conductive interconnect traces formed therein, a first outer conductive layer located above and separated from the first intermediate conductive layer by a first dielectric layer, and a second outer conductive layer located below and separated from the first intermediate conductive layer by a second dielectric layer, wherein the first outer conductive layer forms a first power supply conductive plate, and the second outer conductive layer forms a second power supply conductive plate;

plated vias traversing through the first intermediate conductive layer, the first and second outer conductive layers, and the first and second dielectric layers to provide an electrical connection between at least two of the conductive layers; and circuit mounting pads formed in either the first or second outer conductive layer and sized to accept a circuit component, wherein one of the plated vias traverses through one of the circuit mounting pads such that the plated via is located in a region of the mounting pad which is beneath the circuit component when the circuit component is connected to the mounting pad.

2. The multiple layer printed circuit board of claim 1 wherein the circuit component is a surface mount device.

3. The multiple layer printed circuit board of claim 1 wherein the circuit component is soldered to the mounting pad.

4. The multiple layer printed circuit board of claim 1 further comprising:

a solder mask located on a top surface of the first outer conductive layer, the solder mask having first openings therein to expose the circuit mounting pads formed in the first outer conductive layer, the solder mask having second openings located in regions of the printed circuit board not intended to be populated such that the second openings expose the first outer conductive layer to provide heat dissipation openings.

5. A multiple layer printed circuit board comprising:

a first intermediate conductive layer having conductive interconnect traces formed therein;

a first outer conductive layer located above the first intermediate conductive layer and separated from the first intermediate conductive layer by a first dielectric layer;

a second outer conductive layer located below the first intermediate conductive layer and separated from the first intermediate conductive layer by a second dielectric layer, wherein the first outer conductive layer is coupled to a first power supply voltage to provide a first power supply conductive plate, and the second outer conductive layer is coupled to a second power supply voltage to provide a second power supply conductive plate; and a solder mask located on a top surface of the first outer conductive layer, the solder mask having first openings located in regions of the printed circuit board not intended to be populated such that the second openings expose the first outer conductive layer to provide heat dissipation openings.

6. The multiple layer printed circuit board of claim 5 further comprising:

a plurality of plated vias traversing through the first intermediate conductive layer, the first and second outer conductive layers, and the first and second dielectric layers to provide an electrical connection between at least two of the conductive layers; and circuit mounting pads formed in either the first or second outer conductive layers, the circuit mounting pads are sized to accept a circuit component, wherein one of the plurality of plated vias traverses through one of the circuit mounting pads such that the plated via is located in a region of the mounting pad which is beneath the circuit component when the circuit component is connected to the mounting pad.

7. The multiple layer printed circuit board of claim 6 further wherein the solder mask further comprises second openings therein to expose the circuit mounting pads formed in the first outer conductive layer.

8. The multiple layer printed circuit board of claim 6 wherein the circuit component is a surface mount device.

9. The multiple layer printed circuit board of claim 6 wherein the circuit component is soldered to the mounting pad.

10. A printed circuit board comprising:

an outer conductive layer to carry a power supply voltage, the outer conductive layer being on a first side of the printed circuit board and having a plurality of mounting pads electrically isolated therein, each of the plurality of mounting pads including:

a first conductive region sized to accept a circuit device intended to be soldered to the mounting pad, wherein the first conductive region is located beneath the circuit device when the circuit device is soldered to the mounting pad;

a second conductive region, which is integral with the first conductive region, the second conductive region is located laterally outside of the circuit device when the circuit device is soldered to the mounting pad, such that the second conductive region provides a solder fillet area; and a plated via located in the first conductive region and extending downwardly through the mounting pad for electrical interconnection with conductive regions located below the mounting pad.

11. The printed circuit board of claim 10 further including a second outer conductive layer to carry a second power supply voltage, the second outer conductive layer being on a second side of the circuit board.

12. The printed circuit board of claim 10 wherein the circuit device is a surface mount component.

13. A method of fabricating a printed circuit board, the method comprising:

provessing a first dielectric layer;

fabricating a conductive interconnect layer on a bottom surface of the first dielectric layer, the first conductive interconnect layer having interconnect traces formed therein;

fabricating a conductive power plane layer on a top surface of the first dielectric layer;

defining mounting pads in the conductive power plane layer, each mounting pad as a first region for receiving an electronic component, such that the first region is located beneath the electronic component when the electronic component is coupled to the mounting pads; and fabricating an electrically conductive via traversing downwardly through the first region of each mounting pad, such that the electrically conductive via is located beneath the electric component when the electric component is coupled to the mounting pads.

14. The method of claim 13 further comprising:

soldering the electric component to the mounting pads.

15. A method of fabricating a printed circuit board, the method comprising:

providing a first dielectric layer;

fabricating a conductive interconnect layer on a bottom surface of the first dielectric layer, the first conductive interconnect layer having interconnect traces formed therein;

fabricating a conductive power plane layer on a top surface of the first dielectric layer;

fabricating a solder mask on top of the conductive power plane layer; and providing openings in the solder mask to expose the second conductive layer to increasing heat dissipation capabilities, the openings are located in the solder mask in regions which are not intended to be populated with circuit components.

* * * * *